(12) United States Patent
Jaussi et al.

(10) Patent No.: US 7,218,491 B2
(45) Date of Patent: May 15, 2007

(54) ELECTROSTATIC DISCHARGE PROTECTION UNIT INCLUDING EQUALIZATION

(75) Inventors: James E. Jaussi, Hillsboro, OR (US); Bryan K. Casper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 260 days.

(21) Appl. No.: 10/329,058

(22) Filed: Dec. 23, 2002

(65) Prior Publication Data

US 2004/0120092 A1 Jun. 24, 2004

(51) Int. Cl.
*H02H 3/22* (2006.01)
(52) U.S. Cl. ......................... 361/56; 361/111
(58) Field of Classification Search ............ 361/56–58, 361/91.1, 110, 111; 257/355–360
See application file for complete search history.

(56) References Cited

U.S. PATENT DOCUMENTS

| | | | | | |
|---|---|---|---|---|---|
| 3,631,520 | A | * | 12/1971 | Atal | 704/219 |
| 5,946,177 | A | * | 8/1999 | Miller et al. | 361/56 |
| 5,995,354 | A | * | 11/1999 | Yu | 361/111 |
| 6,002,567 | A | * | 12/1999 | Zou et al. | 361/111 |
| 6,040,968 | A | * | 3/2000 | Duvvury et al. | 361/56 |
| 6,323,697 | B1 | * | 11/2001 | Pavan | 327/94 |
| 6,424,335 | B1 | * | 7/2002 | Kim et al. | 345/158 |
| 6,433,985 | B1 | * | 8/2002 | Voldman et al. | 361/113 |
| 6,567,966 | B2 | * | 5/2003 | Miller | 716/10 |
| 6,624,699 | B2 | * | 9/2003 | Yin et al. | 330/260 |
| 6,744,610 | B2 | * | 6/2004 | Chang et al. | 361/56 |
| 6,760,205 | B1 | * | 7/2004 | Gaboury | 361/56 |

OTHER PUBLICATIONS

Schaumann, R. , et al., "Section 3.2 Realization With Passive Elements", In: *Design of Analog Filters*, Oxford University Press, Inc., New York, NY,(2001),67-78.

* cited by examiner

*Primary Examiner*—Brian Sircus
*Assistant Examiner*—Danny Nguyen
(74) *Attorney, Agent, or Firm*—Schwegman, Lundberg, Woessner & Kluth, P.A.

(57) ABSTRACT

An electrostatic discharge protection unit includes a channel, a passive filter, and an electrostatic discharge protection circuit. The passive filter and the electrostatic discharge protection circuit are formed on a substrate. The electrostatic discharge protection circuit couples the channel to the passive filter. A method includes, for a channel having a bandwidth determining the bandwidth, and generating a transfer function for a passive filter which when combined in series an electrostatic discharge protection circuit and the channel yields a combination transfer function which has a combination bandwidth that is greater than the channel transfer function bandwidth.

18 Claims, 7 Drawing Sheets

FIG. 1K  CHANNEL TRANSFER FUNCTION

FIG. 1L  PASSIVE FILTER TRANSFER FUNCTION

FIG. 1M  COMBINATION TRANSFER FUNCTION (CHANNEL + PASSIVE FILTER)

ELECTROSTATIC DISCHARGE PROTECTION UNIT INCLUDING EQUALIZATION

FIELD

This invention relates to equalizers and, more particularly, to equalization in connection with an electrostatic discharge protection unit.

BACKGROUND

Electronic systems, such as communication systems, computing systems, and gaming systems, are often redesigned to operate at higher frequencies. Many problems arise during the process of redesigning electronic systems to operate at higher frequencies. Until recently, some of these problems were overcome by improving the performance of the most elementary electronic component in the system. For example, the bandwidth of many systems that used bipolar junction transistors as a basic building block was increased by increasing the operating power level in the systems. A higher power level translated to a high switching speed for the individual transistors and a higher operating frequency for the system. Even though this strategy is still used today, at high frequencies, electrical system effects, such as parasitic capacitances, can negate performance improvements in the elementary electronic components.

In the field of high speed digital signaling, existing system constraints cannot be ignored by the designers who are assigned the task of redesigning a system to operate at a higher frequency. For example, to improve the performance of a logic system designed with electronics that are sensitive to electrostatic discharge, the speed of the system must be increased without removing the circuits that protect the system from destruction through electrostatic discharge. Often these protective circuits introduce electrical system effects that limit the high frequency performance of a system. The traditional approach of improving the speed of the transmitting and receiving transistors does not help increase the operating frequency of these systems. Therefore, new systems and methods are required to increase the operating frequency of electronic systems.

DESCRIPTION

In the following detailed description of some embodiments of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Figure 1A:
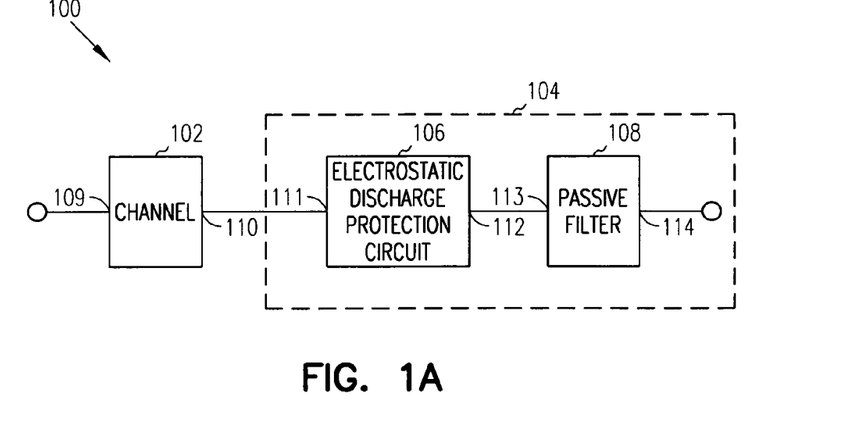
FIG. 1A is a block diagram of an electrostatic discharge protection unit including a channel, a substrate, an electrostatic discharge protection circuit, and a passive filter in accordance with one embodiment of the invention.

FIG. 1A is a block diagram of an electrostatic discharge protection unit 100 including a channel 102, a substrate 104, an electrostatic discharge protection circuit 106, and a passive filter 108 in accordance with one embodiment of the invention. The electrostatic discharge protection circuit 106 and the passive filter 108 are formed on the substrate 104. The electrostatic discharge protection circuit 106 couples the channel 102 to the passive filter 108. The channel 102 includes an input port 109 and an output port 110. The electrostatic discharge protection circuit 106 includes an input port 111 and an output port 112. The passive filter 108 includes an input port 113 and an output port 114. The input port 111 of the electrostatic discharge protection circuit 106 is coupled to the output port 110 of the channel 102. The input port 113 of the passive filter 108 is coupled to the output port 112 of the electrostatic discharge protection circuit 106.

Figure 1B:
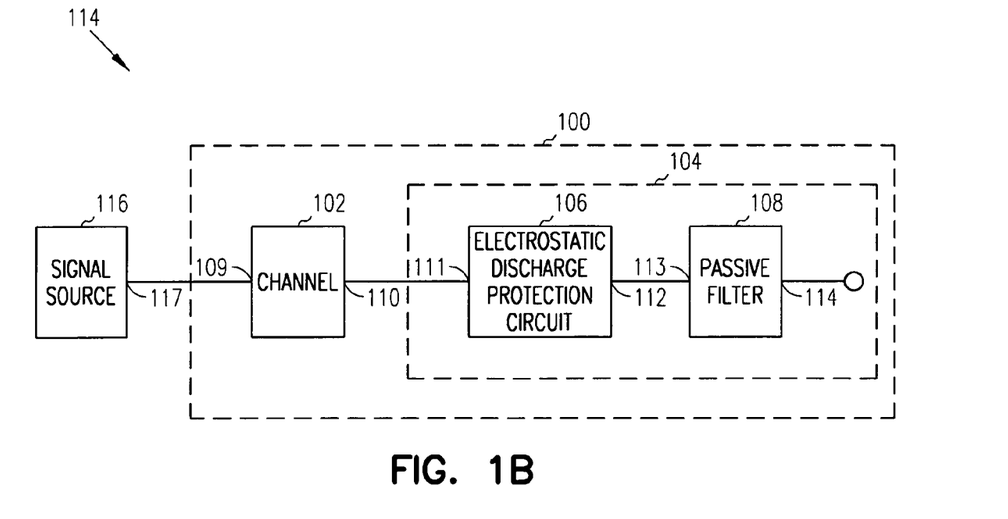
FIG. 1B is a block diagram of a signaling unit including a signal source coupled to the channel of the electrostatic discharge protection unit shown in FIG. 1A.

FIG. 1B is a block diagram of a signaling unit 114 including a signal source 116 coupled to the channel 102 of the electrostatic discharge protection unit 100 shown in FIG. 1A. The electrostatic discharge protection unit 100 includes the channel 102, the substrate 104, the electrostatic discharge protection circuit 106, the passive filter 108, the input ports 109, 111, and 113, and the output ports 110, 112, and 114. The input port 111 of the electrostatic discharge protection circuit 106 is coupled to the output port 110 of the channel 102. The input port 113 of the passive filter 108 is coupled to the output port 112 of the electrostatic discharge protection circuit 106. The signal source 116 includes an output port 117. The output port 117 is coupled to the input port 109 of the channel 102. The signal source 116 provides a signal to the channel 102. In one embodiment, the signal source 116 is a line-driver suitable for driving a lossy transmission line. Lossy transmission lines include transmission lines fabricated on FR4 circuit boards. In another embodiment, the signal source 116 is a line-driver capable of driving a lossy transmission line with a clock signal having a frequency of between about one gigahertz and about five gigahertz.

The channel 102 is the transmission medium between the signal source 116 and the substrate 104. In one embodiment, the channel 102 is a transmission line. The channel 102 can include interconnects (not shown), dielectrics (not shown) and free space. The transfer function defines the relationship between a signal at the input port 109 and the output port 110 of the channel 102.

The substrate 104 provides a site for fabricating the electrostatic discharge protection circuit 106 and the passive filter 108. Materials suitable for use in the fabrication of integrated circuits, such as logic circuits, analog circuits, and mixed signal circuits, are suitable for use in connection with the fabrication of the substrate 104. Exemplary materials suitable for use in connection with the fabrication of the substrate 104 include semiconductors, such as silicon, germanium, gallium arsenide, indium phosphide, silicon-on-sapphire, and germanium-on-silicon.

Figure 1C:
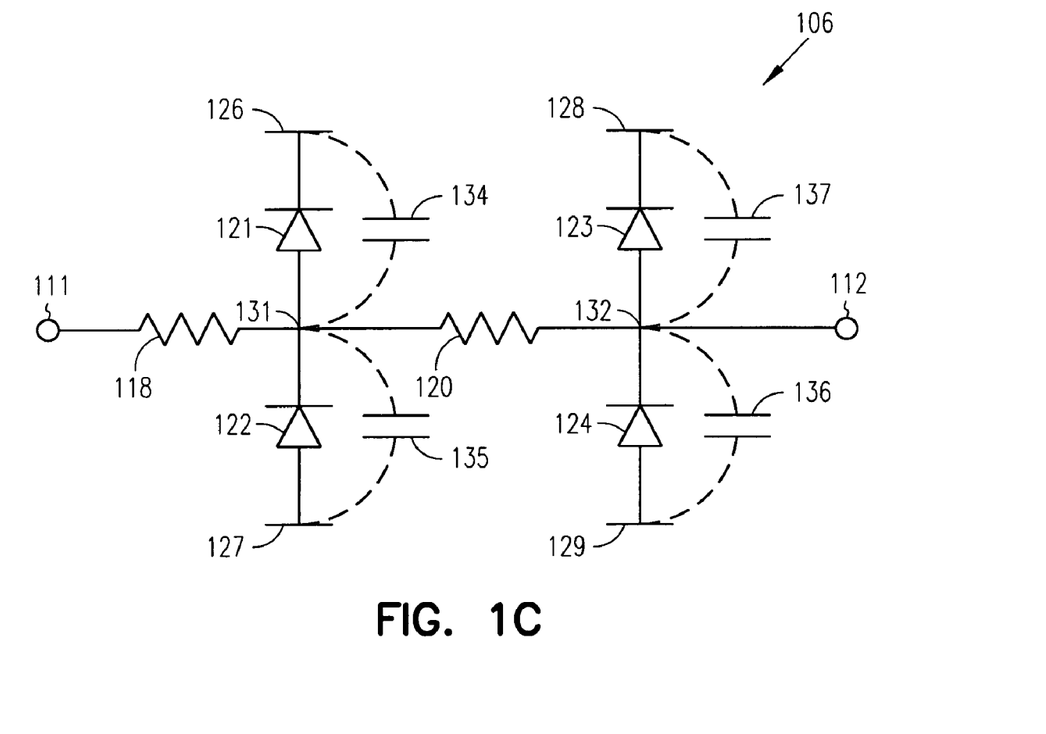
FIG. 1C is a schematic diagram of the electrostatic discharge protection circuit shown in FIG. 1A in accordance with another embodiment of the invention.

FIG. 1C is a schematic diagram of the electrostatic discharge protection circuit 106 shown in FIG. 1A in accordance with another embodiment of the invention. The electrostatic discharge protection circuit 106 is only one example of an electrostatic discharge protection circuit suitable for use in connection with the electrostatic discharge protection unit 100 (shown in FIG. 1A). The electrostatic discharge protection circuit 106 includes resistors 118 and 120 and diodes 121, 122, 123, and 124. The resistors 118 and 120 provide a signal path from the input port 111 to the output port 112. The diodes 121 and 122 are connected between potential nodes 126 and 127. The diodes 123 and 124 are connected between potential nodes 128 and 129. The diodes 121, 122, 123, and 124 provide conductive paths to the potential nodes 126, 127, 128, and 129 to shunt static charge build-up at the nodes 131 and 132. Parasitic capacitances 134, 135, 136, and 137 are included in the schematic to account for electrical effects produced by free space and the substrate 104 (shown in FIG. 1A) including dielectrics and interconnects.

Referring again to FIG. 1A, the passive filter 108 provides equalization for signals provided to the passive filter 108 from the electrostatic discharge protection circuit 106 and the channel 102. The passive filter 108 does not include active, or energy adding elements, such as operational amplifiers or differential amplifiers. The passive filter 108 includes only passive elements, such as resistors, capacitors, and inductors. Thus, the passive filter 108 provides equalization by attenuating low frequency signal components more than high frequency signal components. FIGS. 1D, 1E, 1F, 1G, 1H, and 1I illustrate embodiments of the passive filter 108 suitable for use in connection with the electrostatic discharge protection unit 100. The embodiments of the passive filter 108 shown in FIGS. 1D, 1E, 1H, 1I, and 1J include a potential node 140. The potential node 140 can provide a zero potential, a non-zero potential, or a variable potential.

Figure 1D:
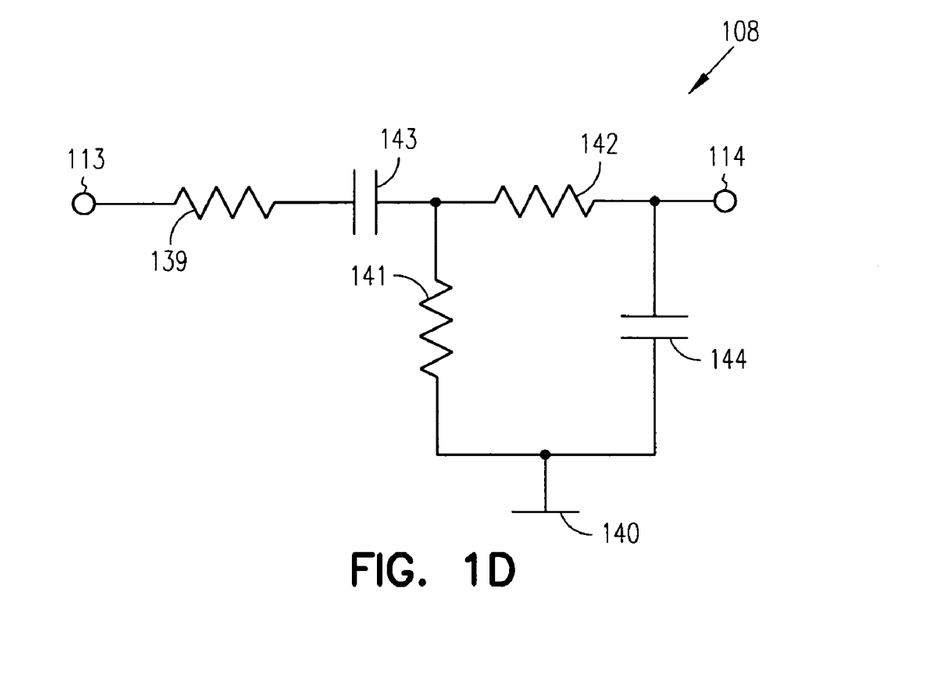
FIG. 1D is a schematic diagram of the passive filter shown in FIG. 1A in accordance with another embodiment of the invention.

FIG. 1D is a schematic diagram of the passive filter 108 shown in FIG. 1A in accordance with another embodiment of the invention. The passive filter 108 includes the input port 113, the output port 114, resistors 139, 141, and 142, and capacitors 143 and 144. At low frequencies, the capacitors 143 and 144 are substantially open circuits. A direct-current signal at the input port 113 is blocked by the capacitor 143. Thus, the passive filter 108 does not include a direct-current path and a direct-current signal at the input port 113 is not transmitted to the output port 114.

At high frequencies, the capacitors 143 and 144 are substantially short circuits. A signal at the input port 113 is first divided between the resistor 139 and the parallel combination of the resistors 141 and 142. The resulting signal is divided across the capacitor 144 (the impedance being determined by the capacitance and the signal frequency) and the resistor 142 to provide an attenuated signal at the output port 114.

Figure 1E:
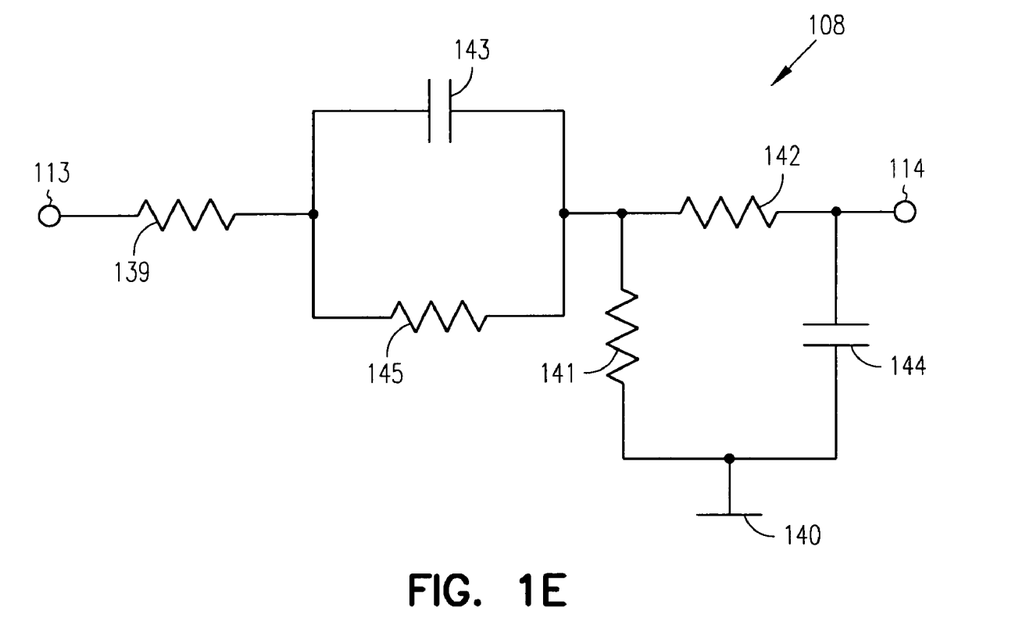
FIG. 1E is a schematic diagram of the passive filter shown in FIG. 1A in accordance with another embodiment of the invention.

FIG. 1E is a schematic diagram of the passive filter 108 shown in FIG. 1A in accordance with another embodiment of the invention. The passive filter 108 includes the input port 113, the output port 114, the resistors 139, 141, and 142, and the capacitors 143 and 144, as shown in FIG. 1D, and a resistor 145. The resistor 145 is arranged in parallel with the capacitor 143. At low frequencies, the capacitors 143 and 144 are substantially open circuits. A signal at the input port 114 is divided across the resistor 141 and the series combination of resistors 139 and 145 to provided an attenuated signal at the output port 114.

At high frequencies, the capacitors 143 and 144 are substantially short circuits. A signal at the input port 113 is first divided across the resistor 139 and the parallel combination of the resistors 141 and 142. The resulting signal is divided across the capacitor 144 (the impedance being determined by the capacitance and the signal frequency) and the resistor 142 to provide an attenuated signal at the output port 114.

Figure 1F:
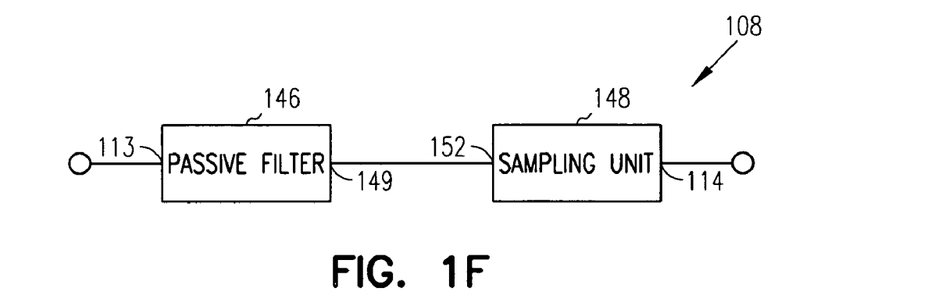
FIG. 1F is a block diagram of the passive filter shown in FIG. 1A including a passive filter connected in series with a sampling unit in accordance with another embodiment of the invention.

FIG. 1F is a block diagram of the passive filter 108 shown in FIG. 1A including a passive filter 146 connected in series with a sampling unit 148 in accordance with another embodiment of the invention. The passive filter 108 includes the input port 113 and the output port 114. The passive filter 146 includes an output port 149. The sampling unit 148 includes an input port 152. The input port 152 of the sampling unit 148 is coupled to the output port 149 of the passive filter 146.

Figure 1G:
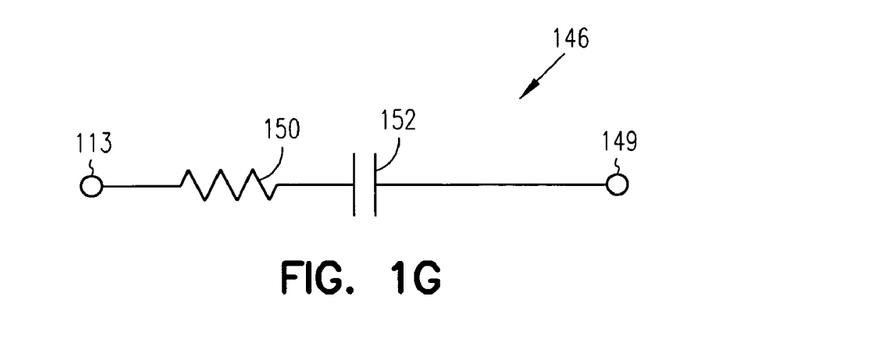
FIG. 1G is a schematic diagram of the passive filter (the passive filter connected in series with the sampling unit) shown in FIG. 1F in accordance with another embodiment of the invention.

FIG. 1G is a schematic diagram of the passive filter 146 (the passive filter connected in series with the sampling unit) shown in FIG. 1F in accordance with another embodiment of the invention. The passive filter 146 includes a resistor 150 connected in series with a capacitor 152. At low frequencies, the capacitor 152 is a substantially open circuit and blocks direct-current signals at the input port 113 from being transmitted to the output port 149. At high frequencies, the capacitor 152 is a substantially short circuit. A signal at the input port 113 is provided at the output port 149.

Figure 1H:
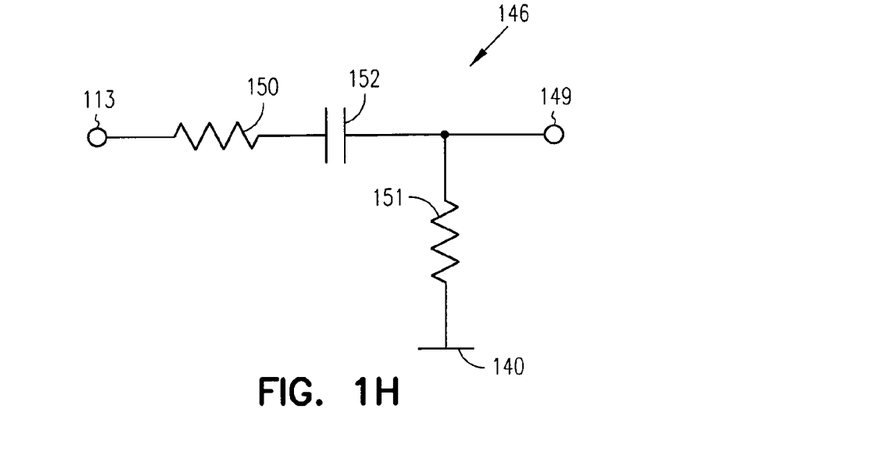
FIG. 1H is a schematic diagram of the passive filter (the passive filter connected in series with the sampling unit) shown in FIG. 1F in accordance with another embodiment of the invention.

FIG. 1H is a schematic diagram of the passive filter 146 shown in FIG. 1F in accordance with another embodiment of the invention. The passive filter 146 includes the resistor 150 and the capacitor 152, as shown in FIG. 1G, and a capacitor 151. At low frequencies, the capacitor 152 is a substantially open circuit and blocks direct-current signals at the input port 113 from being transmitted to the output port 149. At high frequencies, the capacitor 152 is a substantially short circuit. A signal at the input port 113 divides across the resistor 151 and the resistor 150 to provide an attenuated signal at the output port 149.

Figure 1I:
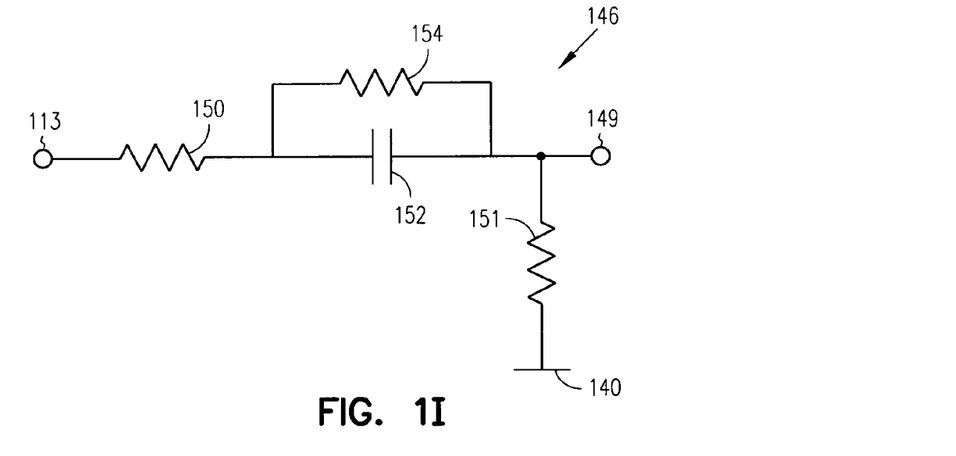
FIG. 1I is a schematic diagram of the passive filter (the passive filter connected in series with the sampling unit) shown in FIG. 1F in accordance with another embodiment of the invention.

FIG. 1I is a schematic diagram of the passive filter 146 shown in FIG. 1F in accordance with another embodiment of the invention. The passive filter 146 includes the resistors 150 and 151, the capacitor 152 shown in FIG. 1G, and a resistor 154. The resistor 154 is connected in parallel with the capacitor 152. At low frequencies, the capacitor 152 is a substantially open circuit. A signal at the input port 113 divides across the resistor 151 and the series combination of the resistors 150 and 154 to provide an attenuated signal at the output port 149. At high frequencies, the capacitor 152 is a substantially short circuit. A signal at the input port 113 divides across the resistor 151 and the resistor 150 to provide an attenuated signal at the output port 149.

Figure 1J:
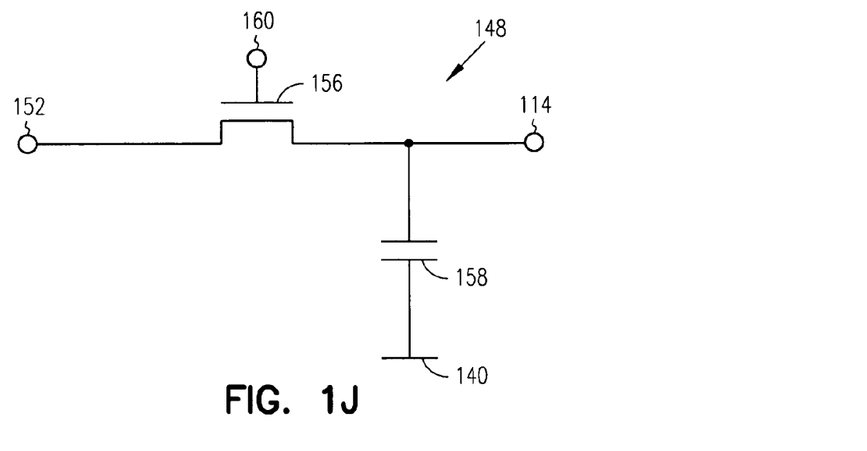
FIG. 1J is a schematic diagram of the sampling unit shown in FIG. 1F in accordance with another embodiment of the invention.

FIG. 1J is a schematic diagram of the sampling unit 148 shown in FIG. 1F in accordance with another embodiment of the invention. The sampling unit 148 includes at least one energy storage device. The sampling unit 148 includes an insulated gate field-effect transistor 156, a capacitor 158, and a potential node 140. The insulated gate field-effect transistor 156 includes a control port 160. The capacitor 158 is not limited to a particular type of capacitor. Poly-poly capacitors, metal capacitors, and trench capacitors are suitable for use in connection with the sampling unit 148. Poly-poly capacitors include two or more layers of polysilicon. Metal capacitors include metal-oxide-metal or metal-oxide/nitride/oxide-metal structures. Trench capacitors include polysilicon-oxide-silicon structures formed in a trench. The potential node 140 provides a zero potential, a non-zero potential, or a variable potential. In operation, the insulated gate field-effect transistor 156 functions as a switch to gate a signal at the input port 152 to the capacitor 158. A control signal at the control port 160 enables and disables the transmission of the signal at the input port 152 to the capacitor 158 and the output port 114.

Figure 1K:
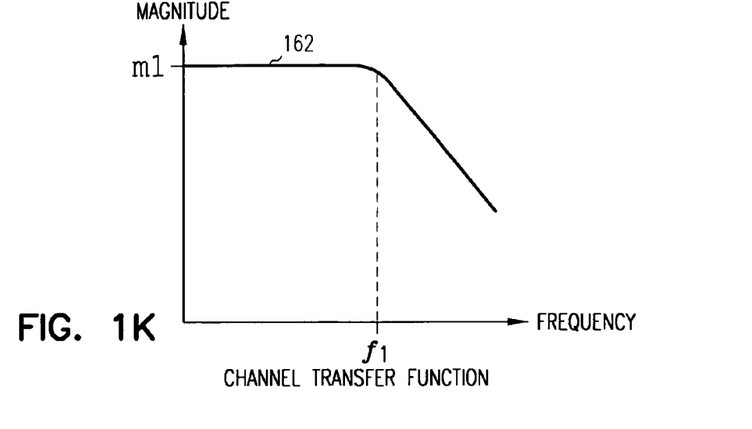
FIG. 1K is a magnitude-versus-frequency graph of a channel transfer function for the channel shown in FIG. 1A.

FIG. 1K is a magnitude-versus-frequency graph of a channel transfer function 162 for the channel 102 shown in FIG. 1A. The channel transfer function 162 approximates a low-pass filter transfer function. The channel transfer function is substantially flat with a magnitude ml for low frequencies and decreases for frequencies greater than the channel cut-off frequency f1

Figure 1L:
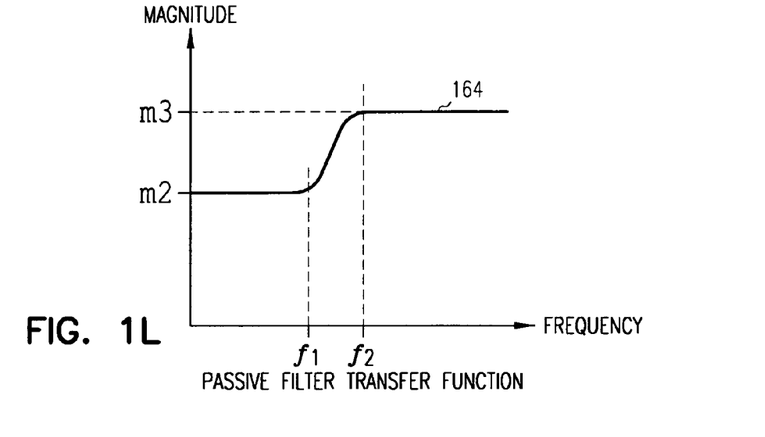
FIG. 1L is a magnitude-versus-frequency graph of a passive filter transfer function for the passive filter shown in FIG. 1A.

FIG. 1L is a magnitude-versus-frequency graph of a passive filter transfer function 164 for the passive filter 108 shown in FIG. 1A. The passive filter transfer function 164 is substantially flat with a magnitude m2 (m2 is less than m1) for low frequencies. The magnitude increases for frequencies greater than the channel cutoff frequency f1 up to a frequency f2. The passive filter transfer function 164 is substantially flat with a magnitude m3 for frequencies greater than f2.

Figure 1M:
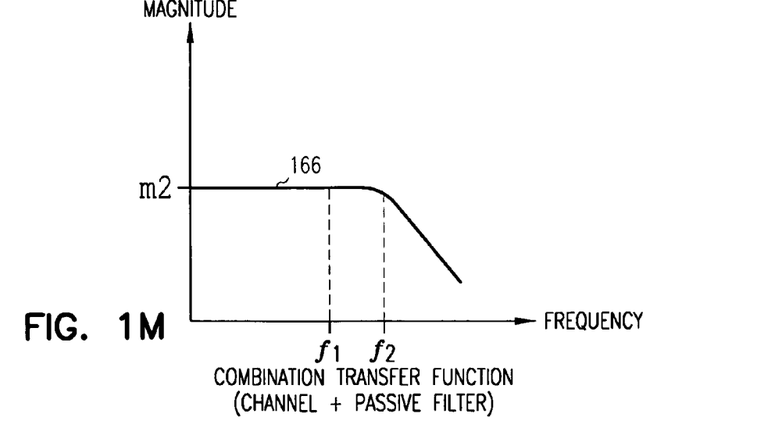
FIG. 1M is a magnitude-versus-frequency graph of a combination transfer function for the channel transfer function shown in FIG. 1K and the passive filter transfer function shown in FIG. 1L.

FIG. 1M is a magnitude-versus-frequency graph of a combination transfer function 166 for the channel transfer function 162 shown in FIG. 1K and the passive filter transfer function 164 shown in FIG. 1L. The combination transfer function 166 (or electrostatic discharge protection unit 100 (shown in FIG. 1A) transfer function) approximates a low-pass filter transfer function. The combination transfer function 166 is substantially flat with a magnitude m2 for frequencies less than the frequency f2. For frequencies greater than the frequency f2 the combination transfer function 166 decreases. Thus, the frequency f2 is the cutoff frequency for the combination transfer function 166. The cutoff frequency f2 is greater than the cutoff frequency f1, so the bandwidth of the combination transfer function 166 is greater than the bandwidth of the channel transfer function 162 shown in FIG. 1K.

Figure 1N:
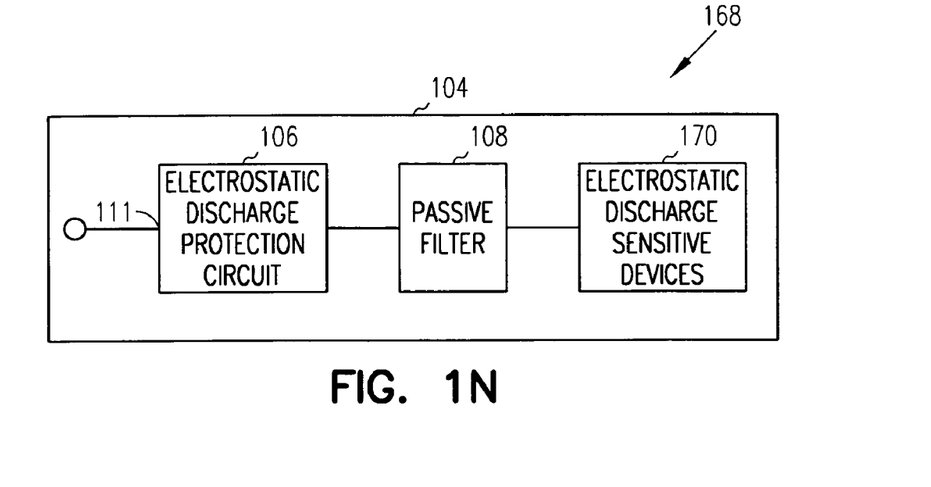
FIG. 1N is a block diagram of a circuit including one or more electrostatic discharge sensitive devices, an electrostatic discharge protection circuit, and a passive filter formed on a substrate in accordance with another embodiment of the invention.

FIG. 1N is a block diagram of a circuit 168 including one or more electrostatic discharge sensitive devices 170, the electrostatic discharge protection circuit 106, and the passive filter 108 formed on the substrate 104 in accordance with another embodiment of the invention. The one or more electrostatic discharge sensitive devices 170 includes electronic devices, such as transistors and diodes, that can be damaged by exposure to electrostatic discharges. The passive filter 108 couples the electrostatic discharge protection circuit 106 to at least one of the one or more electrostatic discharge sensitive devices 170. The circuit 168 provides electrostatic discharge protection for at least one of the one or more electrostatic discharge sensitive devices 170 and equalization for signals provided at the input port 111. The circuit 168 provides transmission only for signals having a non-zero frequency component when used in connection with the passive filter 108 shown in FIG. 1D.

The circuit 168 is not limited to use in connection with a particular type of electrostatic discharge sensitive device. Exemplary devices sensitive to electrostatic discharge include transistors, such as insulated gate field-effect transistors, and diodes. The circuit 168 is not limited to use in connection with a particular passive filter. Some passive filters suitable for use in connection with the circuit 168 include the passive filters shown in FIGS. 1D, 1E, and 1F. The circuit 168 is also not limited to use in connection with a particular electrostatic discharge protection circuit. One electrostatic discharge protection circuit suitable for use in connection with circuit 168 is shown in FIG. 1C.

Figure 1O:
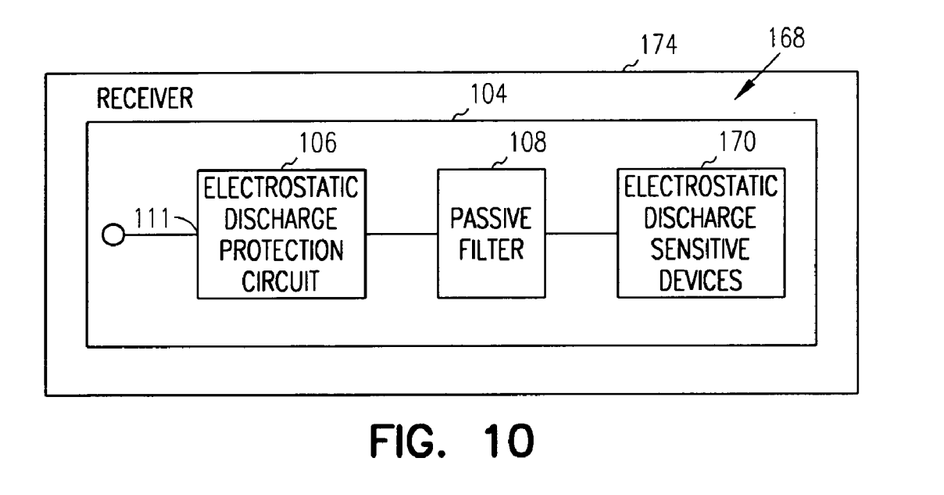
FIG. 1O is a block diagram of a receiver including the circuit shown in FIG. 1N in accordance with another embodiment of the invention.

FIG. 1O is a block diagram of a receiver 174 including the circuit 168 shown in FIG. 1N in accordance with another embodiment of the invention. The circuit 168 includes the input port 111, the one or more electrostatic discharge sensitive devices 170, the electrostatic discharge protection circuit 106, and the passive filter 108 formed on the substrate 104. The receiver 174 is a device for receiving information over distances. The receiver 174 is not limited to a particular communication medium. Free space, conductive materials, optical materials, and tactile materials are all suitable for use in connection with the receiver 174. Exemplary receivers suitable for use in connection with the circuit 168 include radio receivers, television receivers, optical receivers, microwave receivers, and acoustic receivers.

Figure 1P:
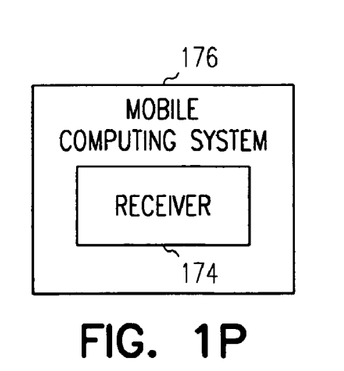
FIG. 1P is a block diagram of a mobile computing system including the receiver shown in FIG. 1O in accordance with another embodiment of the invention.

FIG. 1P is a block diagram of a mobile computing system 176 including the receiver 174 shown in FIG. 1O in accordance with another embodiment of the invention. The mobile computing system 176 is not limited to a particular type of mobile computing system. Exemplary mobile computing systems suitable for using in connection with the receiver 174 include notebook computers, sub-notebook computers, laptop computers, tablet computers, pocket computers, and calculators.

Figure 1Q:
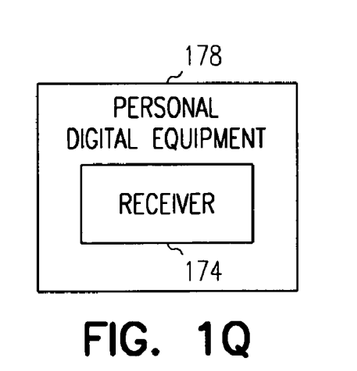
FIG. 1Q is a block diagram of a personal digital assistant including the receiver shown in FIG. 1O in accordance with another embodiment of the invention.

FIG. 1Q is a block diagram of a personal digital assistant 178 including the receiver 174 shown in FIG. 1O in accordance with another embodiment of the invention. The personal digital assistant 178 is not limited to a particular type of personal digital assistant. Exemplary personal digital assistants suitable for use in connection with the receiver 174 include palm size personal digital assistants, watch size personal digital assistants, and personal digital assistants in combination with a cell phone.

Figure 1R:
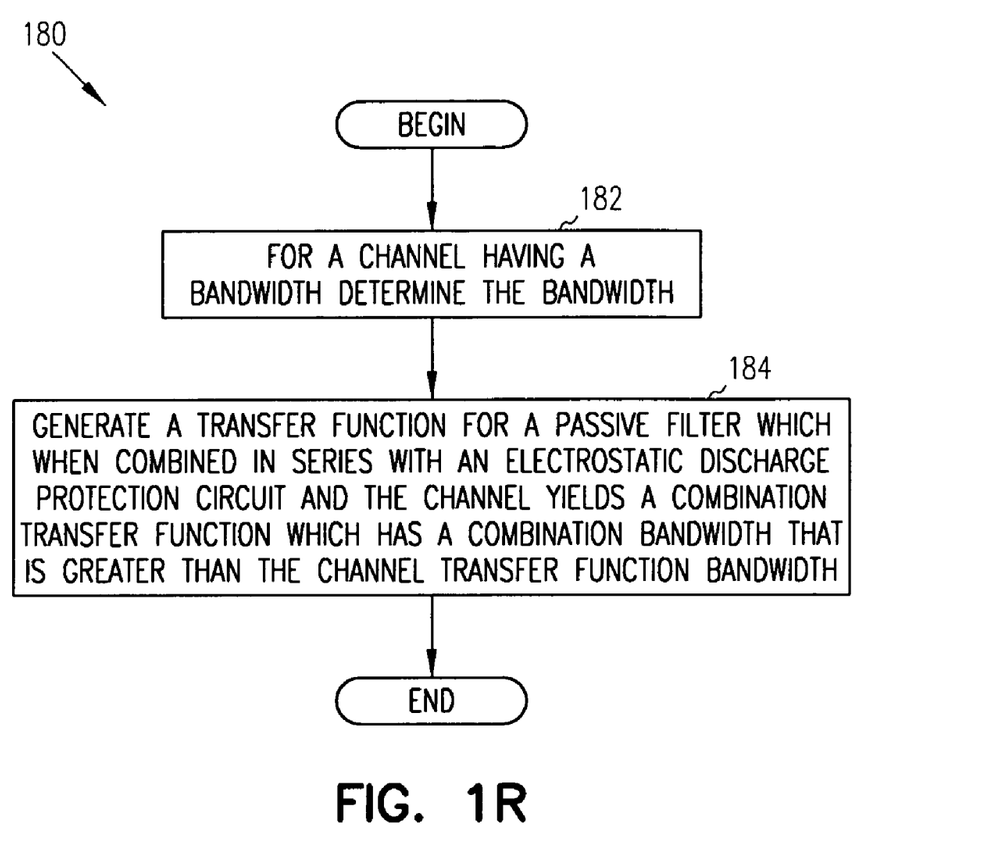
FIG. 1R is a flow diagram of a method for generating a transfer function in accordance with another embodiment of the invention.

FIG. 1R is a flow diagram of a method 180 for generating a transfer function in accordance with another embodiment of the invention. The method 180 includes for a channel having a bandwidth, determining the bandwidth (block 182) and generating a transfer function for a passive filter which when combined in series an electrostatic discharge protection circuit and the channel yields a combination transfer function which has a combination bandwidth that is greater than the channel transfer function bandwidth (block 184). The channel transfer function is obtained for a channel that includes an electrostatic discharge protection circuit. The passive filter transfer function is combined in series with the channel transfer function. The passive filter transfer function is selected to ensure that the transfer function of the combination has a bandwidth that is greater than the bandwidth of the channel transfer function. In another embodiment, generating the transfer function for the passive filter includes generating the transfer function to block direct-current. In another embodiment, generating the transfer function for the passive filter includes generating the transfer function for the passive filter that includes a sampling unit transfer function.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. An electrostatic discharge protection unit comprising:
   a channel having a transfer function including a channel cutoff frequency, wherein the transfer function approximates a low pass filter transfer function;
   a passive filter formed on a substrate, wherein the passive filter connected in series with a sampling unit and wherein the sampling unit includes an insulated gate field-effect transistor; and
   an electrostatic discharge protection circuit formed on the substrate to couple the channel to the passive filter.

2. The electrostatic discharge protection unit of claim 1, wherein the substrate comprises germanium.

3. An electrostatic discharge protection unit comprising:
   a channel having a transfer function including a channel cutoff frequency, wherein the transfer function approximates a low pass filter transfer function;
   a passive filter formed on a substrate, wherein the passive filter connected in series with a sampling unit and wherein the sampling unit includes a metal oxide/nitride oxide-metal capacitor; and
   an electrostatic discharge protection circuit formed on the substrate to couple the channel to the passive filter.

4. The electrostatic discharge protection unit of claim 3, wherein the substrate comprises silicon-on-sapphire.

5. A circuit comprising:
   a frequency dependent transmission line having a transfer function that approximates a low pass filter transfer function, the frequency dependent transmission line coupled to one or more electrostatic discharge sensitive devices formed on a substrate;
   an electrostatic discharge protection circuit formed on the substrate; and
   a passive filter formed on the substrate, the passive filter having no direct-current path, the passive filter to couple the electrostatic discharge protection circuit to at least one of the one or more electrostatic discharge sensitive devices, and wherein the passive filter includes a filter having only one energy storage element connected in series with a sampling unit.

6. The circuit of claim 5, wherein the only one energy storage element comprises a capacitor.

7. The circuit of claim 6, wherein the capacitor comprises a metal-oxide-metal capacitor.

8. The circuit of claim 7, wherein the substrate comprises silicon.

9. A method comprising:
   determining the bandwidth for a channel having a frequency dependent transfer function; and generating a transfer function for a passive filter which when combined in series an electrostatic discharge protection circuit and the channel yields a combination transfer function which has a combination bandwidth that is greater than the channel transfer function bandwidth.

10. The method of claim 9, wherein generating the transfer function for the passive filter comprises generating the transfer function to block direct-current.

11. A method comprising:

determining the bandwidth for a channel having a frequency dependent transfer function; and generating a transfer function for a passive filter which when combined in series an electrostatic discharge protection circuit and the channel yields a combination transfer function which has a combination bandwidth that is greater than the channel transfer function bandwidth, wherein generating the transfer function for the passive filter comprises generating the transfer function for the passive filter that connects in series with a sampling unit transfer function.

12. The method of claim 11, wherein determining the bandwidth for the channel includes the frequency dependent transfer function of the channel having a cutoff frequency and a transfer function that approximates a low pass filter transfer function.

13. The method of claim 11, wherein the combined transfer function has a magnitude that is substantially flat at frequencies less than a cutoff frequency for the combined transfer function.

14. The method of claim 13, wherein the magnitude of the combined transfer function is less than a magnitude for the frequency dependent transfer function of the channel at frequencies less than the cutoff frequency for the combined transfer function.

15. A circuit comprising:

a frequency dependent transmission line having a transfer function that approximates a low pass filter transfer function, the frequency dependent transmission line coupled to one or more electrostatic discharge sensitive devices formed on a substrate;

an electrostatic discharge protection circuit formed on the substrate; and a passive filter formed on the substrate, the passive filter having no direct-current path, the passive filter to couple the electrostatic discharge protection circuit to at least one of the one or more electrostatic discharge sensitive devices, wherein the passive filter includes a filter having only one energy storage element connected in series with a sampling unit.

16. The circuit of claim 15, wherein the only one energy storage element comprises a capacitor.

17. The circuit of claim 16, wherein the capacitor comprises a metal-oxide-metal capacitor.

18. The circuit of claim 15, wherein the substrate comprises silicon.

* * * * *

UNITED STATES PATENT AND TRADEMARK OFFICE
CERTIFICATE OF CORRECTION

| | | |
|---|---|---|
| PATENT NO. | : 7,218,491 B2 | Page 1 of 1 |
| APPLICATION NO. | : 10/329058 | |
| DATED | : May 15, 2007 | |
| INVENTOR(S) | : Jaussi et al. | |

It is certified that error appears in the above-identified patent and that said Letters Patent is hereby corrected as shown below:

In column 8, lines 38 and 39 (Approx.), in Claim 3, after "a" delete "metal oxide/nitride oxide-metal capacitor" and insert --metal-oxide/nitride/oxide-metal capacitor--.

Signed and Sealed this

Sixth Day of May, 2008

JON W. DUDAS
*Director of the United States Patent and Trademark Office*